(12) United States Patent
Fujiwara et al.

(10) Patent No.: US 7,102,203 B2
(45) Date of Patent: Sep. 5, 2006

(54) SEMICONDUCTOR DEVICE INCLUDING FIELD-EFFECT TRANSISTOR

(75) Inventors: Hideaki Fujiwara, Tsukuba (JP); Akira Toriumi, Yokohama (JP)

(73) Assignees: Sanyo Electric Co., Ltd., Osaka (JP); National Institute of Advanced Industrial Science and Technology, Tokyo (JP)

( * ) Notice: Subject to any disclaimer, the term of this patent is extended or adjusted under 35 U.S.C. 154(b) by 232 days.

(21) Appl. No.: 10/806,276

(22) Filed: Mar. 23, 2004

(65) Prior Publication Data

US 2004/0188725 A1 Sep. 30, 2004

(30) Foreign Application Priority Data

Mar. 25, 2003 (JP) ............................. 2003-083000

(51) Int. Cl.
*H01L 29/76* (2006.01)
*H01L 29/94* (2006.01)
*H01L 31/062* (2006.01)
*H01L 21/336* (2006.01)

(52) U.S. Cl. ..................................... 257/407; 438/300
(58) Field of Classification Search ................ 257/410, 257/407; 438/592
See application file for complete search history.

(56) References Cited

U.S. PATENT DOCUMENTS

| 5,563,426 A | * | 10/1996 | Zhang et al. | .................. 257/66 |
| 5,677,214 A | * | 10/1997 | Hsu | ............................. 438/297 |
| 6,376,888 B1 | * | 4/2002 | Tsunashima et al. | ........ 257/407 |
| 2002/0011603 A1 | * | 1/2002 | Yagishita et al. | ............ 257/190 |
| 2002/0190284 A1 | * | 12/2002 | Murthy et al. | ............... 257/286 |
| 2003/0034524 A1 | * | 2/2003 | Horiuchi | ...................... 257/347 |
| 2003/0143825 A1 | * | 7/2003 | Matsuo et al. | ............... 438/585 |
| 2004/0183143 A1 | * | 9/2004 | Matsuo | ......................... 257/407 |
| 2005/0037580 A1 | * | 2/2005 | Nakajima et al. | ........... 438/275 |
| 2005/0051854 A1 | * | 3/2005 | Cabral et al. | ................ 257/407 |
| 2005/0208717 A1 | * | 9/2005 | Yeo et al. | .................... 438/239 |

FOREIGN PATENT DOCUMENTS

JP P2002-94058 A 3/2002

OTHER PUBLICATIONS

Brian Doyle, et al., "Transistor Elements for 30nm Physical Gate Lengths and Beyond", Intel Technology Journal, vol. 6, Issue 2, May 16, 2002, ISSN 1535766X.

* cited by examiner

*Primary Examiner*—Carl Whitehead, Jr.
*Assistant Examiner*—Deloris Bryant
(74) *Attorney, Agent, or Firm*—McDermott Will & Emery LLP

(57) ABSTRACT

A semiconductor device capable of inhibiting a threshold voltage from increase also when employing a gate electrode consisting of a metal is provided. This semiconductor device comprises a pair of source/drain regions lifted up in an elevated structure, a gate insulator film, formed on a channel region, consisting of a high dielectric constant insulator film having a dielectric constant larger than 3.9 and a gate electrode including a first metal layer coming into contact with the gate insulator film and having a work function controlled to have a Fermi level around the energy level of a band gap end of silicon constituting the source/drain regions.

6 Claims, 13 Drawing Sheets

SEMICONDUCTOR DEVICE INCLUDING FIELD-EFFECT TRANSISTOR

BACKGROUND OF THE INVENTION

1. Field of the Invention

The present invention relates to a semiconductor device, and more particularly, it relates to a semiconductor device including a MOS field-effect transistor.

2. Description of the Background Art

In a MOS field-effect transistor formed on the surface of a silicon substrate, the interval between source/drain regions is generally reduced following refinement of the device, to easily result in punch through. In order to suppress such punch through, the impurity concentration of a channel region must be increased. When the impurity concentration of the channel region is increased, however, not only the probability of Coulomb scattering resulting from impurities is increased but also the thickness of an inversion layer is more reduced, and hence electrons flowing through the channel region are easily influenced by interfacial scattering on the interface between a gate insulator film and the silicon substrate.

More specifically, electrons are easily jammed to the gate insulator film due to a gate electric field when the thickness of the inversion layer is more reduced, to inconveniently resulting in reduction of electron mobility. A MOS field-effect transistor having an SOI (silicon on insulator) structure is expected as an exemplary countermeasure against such inconvenience. In the MOS field-effect transistor having an SOI structure, the thickness of a silicon layer formed with a channel region is so reduced as to suppress punch through, whereby the impurity concentration of the channel region can be reduced. Thus, the silicon layer can be easily controlled with a gate electric field. Therefore, the gate electric field can be so reduced as to reduce the probability of jamming electrons to a gate insulator film on the interface between the gate insulator film and the silicon layer. Thus, influence by interfacial scattering as well as Coulomb scattering resulting from impurities can be so reduced that electron mobility can be increased in the MOS field-effect transistor having an SOI structure.

In relation to the SOI structure, source/drain regions lifted up in an elevated structure are generally proposed in order to reduce the resistance of the source/drain regions. Such an elevated structure for source/drain regions is disclosed in "Transistor Elements for 30 nm Physical Gate Length and Beyond", Intel Technology Journal, Vol. 06, May 16, 2002, ISSN1535766X, pp. 42–54, for example. According to the structure disclosed in this literature, portions of source/drain regions of a silicon layer serving as an active layer in an SOI structure are lifted up so that the thickness of the source/drain regions of the silicon layer is larger than that of a channel region. Thus, the thickness of the source/drain regions can be increased while reducing that of the channel region, whereby the resistance of the source/drain regions can be reduced while improving electron mobility. According to the structure disclosed in the aforementioned literature, further, a gate electrode consisting of a polysilicon film is formed on the channel region through a gate insulator film consisting of a high dielectric constant insulator film.

In a MOS field-effect transistor of the SOI structure including the source/drain regions elevated in the elevated structure disclosed in the aforementioned literature, however, the gate electrode formed by the polysilicon film is inconveniently depleted in the vicinity of the gate insulator film. When the polysilicon film is depleted in the vicinity of the gate insulator film, the effective thickness of the gate insulator film is increased to disadvantageously deteriorate the device performance.

The gate electrode consisting of the polysilicon film may conceivably be replaced with a gate electrode consisting of a metal. When such a gate electrode (metal gate) consisting of a metal is employed, no metal is depleted in the vicinity of the gate insulator film and hence the effective thickness of the gate insulator film is not increased.

When the gate electrode is made of a metal, however, the Fermi level of the metal is pinned on the interface between the metal gate electrode and the gate insulator film, disadvantageously leading to difficulty in controlling a threshold voltage with a low voltage.

SUMMARY OF THE INVENTION

An object of the present invention is to provide a semiconductor device capable of inhibiting the Fermi level of a metal from pinning when employing a gate electrode consisting of the metal.

A semiconductor device according to a first aspect of the present invention comprises a pair of source/drain regions formed on the main surface of a silicon region at a prescribed interval to define a channel region and lifted up in an elevated structure, a gate insulator film, formed on the channel region, consisting of a high dielectric constant insulator film having a dielectric constant larger than 3.9 and a gate electrode including a first metal layer coming into contact with the gate insulator film and having a work function controlled to have a Fermi level around the energy level of a band gap end of silicon constituting the source/drain regions.

The semiconductor device according to the first aspect, provided with the pair of source/drain regions having the elevated structure as hereinabove described, can reduce the resistance of the source/drain regions. Further, the semiconductor device provided with the gate electrode including the first metal layer coming into contact with the gate insulator film and having the work function controlled to have the Fermi level around the energy level of the band gap end of silicon constituting the source/drain regions can suppress pining on the interface between the gate electrode and the gate insulator film, thereby inhibiting a threshold voltage from increase also when the gate electrode consists of a metal. The first metal layer having the controlled work function is preferably formed by deposition under conditions of a low temperature (not more than −100° C.) and a high vacuum (up to not more than $1 \times 10^6$ Pa) or by ALD (atomic layer deposition) under control at the atomic layer level.

In the aforementioned semiconductor device according to the first aspect, the source/drain regions may include n-type source/drain regions, and the gate electrode may include the first metal layer having the work function controlled to have a Fermi level around the energy level of the conduction band of silicon. According to this structure, an n-channel MOS transistor having the n-type source/drain regions can be easily inhibited from pinning on the interface between a gate electrode and a gate insulator film. In this case, the first metal layer may include an Hf layer.

In the aforementioned semiconductor device according to the first aspect, the source/drain regions may include p-type source/drain regions, and the gate electrode may include the first metal layer having the work function controlled to have a Fermi level around the energy level of the valence band of silicon. According to this structure, a p-channel MOS field-effect transistor having the p-type source/drain regions can be easily inhibited from pinning on the interface between a gate electrode and a gate insulator film. In this case, the first metal layer may include either an Ni layer or an Ir layer.

In the aforementioned semiconductor device according to the first aspect, the gate insulator film consisting of the high dielectric constant insulator film may include at least one film selected from a group consisting of an $HfO_2$ film, a $ZrO_2$ film and an HfAlO film.

In the aforementioned semiconductor device according to the first aspect, the gate electrode preferably includes the first metal layer having the controlled work function and a second metal layer, formed on the first metal layer, having a larger thickness than the first metal layer. According to this structure, a metal layer employed as a general wiring material can be applied to the second metal layer, whereby the gate electrode can be more easily fabricated as compared with the case of forming the gate electrode by only the first metal layer having the controlled work function requiring a relatively complicated fabrication process. According to the present invention, the terms "first metal layer" and "second metal layer" indicate a wide concept including not only layers consisting of simple metals but also layers consisting of metal compounds.

In the semiconductor device including the aforementioned second metal layer, the second metal layer is preferably a metal layer having an uncontrolled work function. According to this structure, a metal layer employed as a general wiring material can be applied to the second metal layer. In this case, the second metal layer may include at least either a TaN layer or a TiN layer.

In the semiconductor device including the aforementioned second metal layer, the first metal layer may be formed in a U shape, and the second metal layer may be formed to fill up a region enclosed with the U-shaped portion of the first metal layer.

The aforementioned semiconductor device according to the first aspect preferably further comprises source/drain electrodes, formed on the upper surfaces of the pair of source/drain regions having the elevated structure to be in contact with the upper surfaces of the pair of source/drain regions without interposition of metal silicide films, including third having a work function controlled to have a Fermi level around the energy level of the band gap end of silicon constituting the source/drain regions. According to this structure, the source/drain regions and the source/drain electrodes can be brought into ohmic contact through extremely low-resistance junctions also when the source/drain regions have low impurity concentrations. Thus, the resistance of sources/drains consisting of the source/drain regions and the source/drain electrodes can be further reduced, and a short channel effect can be suppressed with the source/drain regions having low impurity concentrations also when the semiconductor device is refined. Further, the impurity concentration of the channel region can be reduced due to the suppressed short channel effect, whereby the threshold voltage can be reduced.

In the semiconductor device including the aforementioned source/drain electrodes, the source/drain regions may include n-type source/drain regions, and the source/drain electrodes may include the third metal layers having the work function controlled to have a Fermi level around the energy level of the conduction band of silicon. According to this structure, an n-channel MOS field-effect transistor having the n-type source/drain regions can easily bring the n-type source/drain regions and the source/drain electrodes into ohmic contact through extremely low-resistance junctions also when the n-type source/drain regions have low impurity concentrations. In this case, the third metal layers may include Hf layers.

In the semiconductor device including the aforementioned source/drain electrodes, the source/drain regions may include p-type source/drain regions, and the source/drain electrodes may include the third metal layers having the work function controlled to have a Fermi level around the energy level of the valence band of silicon. According to this structure, a p-channel MOS field-effect transistor having the p-type source/drain regions can easily bring the p-type source/drain regions and the source/drain electrodes into ohmic contact through extremely low-resistance junctions also when the p-type source/drain regions have low impurity concentrations. In this case, the third metal layers may include either Ni layers or Ir layers.

In the semiconductor device including the aforementioned third electrode layers, the pair of source/drain regions having the elevated structure preferably include the third metal layers having the controlled work function and fourth metal layers, formed on the third metal layers, having a larger thickness than the third metal layers. According to this structure, metal layers employed for general source/drain electrodes can be employed as the fourth metal layers, whereby the source/drain electrodes can be more easily fabricated as compared with the case of forming the source/drain electrodes by only the third metal layers having the controlled work function requiring a relatively complicated fabrication process. According to the present invention, the terms "third metal layers" and "fourth metal layers" indicate a wide concept including not only layers consisting of simple metals but also layers consisting of metal compounds.

In the semiconductor device including the aforementioned fourth metal layers, the fourth metal layers are preferably metal layers having an uncontrolled work function. According to this structure, metal layers employed as general wiring materials can be applied to the fourth metal layers. In this case, the fourth metal layers may include at least either TaN layers or TiN layers.

In the aforementioned semiconductor device according to the first aspect, the silicon region preferably includes a silicon layer formed on an insulator. According to this structure, an active layer consisting of a silicon layer having the so-called SOI (silicon on insulator) structure can be formed with a small thickness, thereby suppressing punch through. Thus, the impurity concentration of the channel region can be so reduced as to enable on-off control with a low gate voltage. Therefore, the probability of jamming electrons to the interface between the gate insulator film and the silicon layer is reduced, whereby influence by interfacial scattering as well as Coulomb scattering resulting from impurities can be reduced. Consequently, electron mobility can be increased.

In this case, the semiconductor device preferably further comprises element isolation insulator films formed on the outer sides of the pair of source/drain regions having the elevated structure to reach the insulator. According to this structure, element isolation can be easily performed in the SOI structure including the pair of source/drain regions having the elevated structure.

A semiconductor device according to a second aspect of the present invention comprises a pair of source/drain regions formed on the main surface of a silicon region at a prescribed interval to define a channel region, a gate insulator film, formed on the channel region, consisting of a high dielectric constant insulator film having a dielectric constant larger than 3.9, a gate electrode, formed on the gate insulator film, including a metal layer coming into contact with the gate insulator film and source/drain electrodes, formed on the upper surfaces of the pair of source/drain regions to be in contact with the upper surfaces of the pair of source/drain regions without interposition of metal silicide films, including metal layers having a work function controlled to have a Fermi level around the energy level of a band gap end of silicon constituting the source/drain regions.

The semiconductor device according to the second aspect provided with the source/drain electrodes formed on the upper surfaces of the pair of source/drain regions to be in contact with the upper surfaces of the pair of source/drain regions without interposition of metal silicide films, including the metal layers having the work function controlled to have the Fermi level around the energy level of the band gap end of silicon constituting the source/drain regions as hereinabove described, can bring the source/drain regions and source/drain electrodes into ohmic contact through extremely low-resistance junctions also when the source/drain regions have low impurity concentrations. Thus, the resistance of sources/drains consisting of the source/drain regions and the source/drain electrodes can be further reduced, and a short channel effect can be suppressed with the source/drain regions having low impurity concentrations also when the semiconductor device is refined. Further, the impurity concentration of the channel region can be reduced due to the suppressed short channel effect, whereby the threshold voltage can be reduced.

In the aforementioned semiconductor device according to the second aspect, the source/drain regions may include n-type source/drain regions, and the source/drain electrodes may include the metal layers having the work function controlled to have a Fermi level around the energy level of the conduction band of silicon. According to this structure, an n-channel MOS field-effect transistor having the n-type source/drain regions can easily bring the n-type source/drain regions and the source/drain electrodes into ohmic contact through extremely low-resistance junctions also when the n-type source/drain regions have low impurity concentrations. In this case, the metal layers may include Hf layers.

In the aforementioned semiconductor device according to the second aspect, the source/drain regions may include p-type source/drain regions, and the source/drain electrodes may include the metal layers having the work function controlled to have a Fermi level around the energy level of the valence band of silicon. According to this structure, a p-channel MOS field-effect transistor having the p-type source/drain regions can easily bring the p-type source/drain regions and the source/drain electrodes into ohmic contact through extremely low-resistance junctions also when the p-type source/drain regions have low impurity concentrations. In this case, the metal layers may include either Ni layers or Ir layers.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
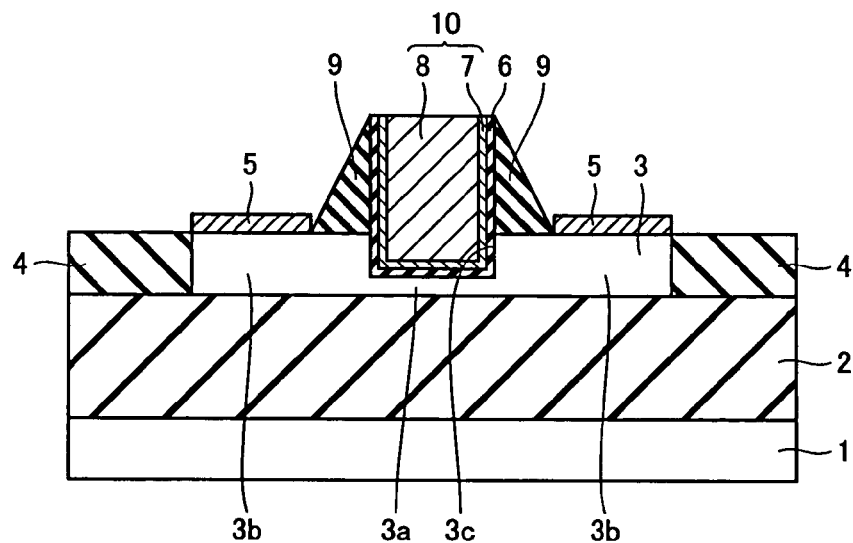
FIG. 1 is a sectional view showing a semiconductor device according to a first embodiment of the present invention.

Embodiments of the present invention are now described with reference to the drawings.

FIRST EMBODIMENT

The structure of a semiconductor device according to a first embodiment of the present invention is described with reference to FIG. 1.

In the semiconductor device according to the first embodiment, an embedded oxide film 2 is formed on a silicon substrate 1. A single-crystalline silicon layer 3 serving as an SOI layer is formed on a prescribed region of the embedded oxide film 2. The single-crystalline silicon layer 3 is an example of the "silicon region" or the "silicon layer" in the present invention. The single-crystalline silicon layer 3 is formed with a pair of n-type source/drain regions 3b to hold a channel region 3a therebetween at a prescribed interval. A recess portion 3c is formed on the channel region 3a of the single-crystalline silicon layer 3. The thickness of the channel region 3a of the single-crystalline silicon layer 3 is about 30 nm, and the thickness of the source/drain regions 3b is about 100 nm. Thus, the source/drain regions 3b are lifted up with respect to the channel region 3a in an elevated structure according to the first embodiment.

Element isolation insulator films 4 of SiN, having a thickness of about 100 nm, reaching the embedded oxide film 2 are formed to enclose the single-crystalline silicon layer 3. A gate insulator film 6, consisting of an HfO$_2$ film employed as a high dielectric constant insulator film, having a U shape is formed in the recess portion 3c of the single-crystalline silicon layer 3 located on the channel region 3a. The HfO$_2$ film has a thickness of about 1 nm in terms of an SiO$_2$ film.

According to the first embodiment, an Hf film 7 having a thickness of about 10 nm is formed along the inner surface of the U-shaped gate insulator film 6. The work function of the Hf film 7 is controlled to about 3.9 eV. Therefore, the Fermi level of the Hf film 7 is located in the vicinity of the energy level of the conduction band of silicon constituting the single-crystalline silicon layer 3. A TaN film 8 having a larger thickness than the Hf film 7 is formed to fill up a region enclosed with the U-shaped Hf film 7. The Hf film 7 having the controlled work function and the TaN film 8 having an uncontrolled work function constitute a metal gate 10. The pair of source/drain regions 3b, the gate insulator film 6 and the metal gate 10 constitute a MOS field-effect transistor having an SOI structure. The Hf film 7 is an example of the "first metal layer" in the present invention, and the TaN film 8 is an example of the "second metal layer" in the present invention. The metal gate 10 is an example of the "gate electrode" in the present invention.

Side wall insulator films 9 of $SiO_2$ are formed on the side surfaces of the U-shaped gate insulator film 6. Metal silicide films 5 of CoSi or the like are formed on the upper surfaces of the source/drain regions 3b.

According to the first embodiment, as hereinabove described, the source/drain regions 3b lifted up with respect to the channel region 3a are so formed in the SOI structure that the resistance of the source/drain regions 3b can be reduced. Further, the metal gate 10 including the Hf film 7 coming into contact with the gate insulator film 6 and having the work function controlled to have the Fermi level around the energy level of the conduction band of silicon constituting the single-crystalline silicon layer 3 is so provided that pinning can be suppressed on the interface between the metal gate 10 and the gate insulator film 6. Thus, the threshold voltage can be controlled with a low voltage.

According to the first embodiment, further, the Hf film 7 having the small thickness of about 10 nm with the controlled work function and the TaN film 8, which is a conventional metal gate material, having the larger thickness than the Hf film 7 constitute the metal gate 10, whereby the metal gate 10 can be more easily fabricated as compared with a case of forming the metal gate 10 by only the Hf film 7 having the controlled work function requiring a relatively complicated fabrication process.

According to the first embodiment, as hereinabove described, punch through is suppressed due to the single-crystalline silicon layer 3 provided with the channel region 3a of the SOI structure having a small thickness, whereby the impurity concentration of the channel region 3a can be reduced. Thus, the semiconductor device can be on-off controlled with a low gate voltage. Therefore, the probability of jamming electrons to the interface between the gate insulator film 6 and the single-crystalline silicon layer 3 is so reduced that influence by interfacial scattering as well as Coulomb scattering resulting from impurities can be reduced. Thus, electron mobility can be so increased as to improve the working speed.

According to the first embodiment, the element isolation insulator films 4 of SiN are provided outside the source/drain regions 3b having the elevated structure to reach the embedded oxide film 2, whereby element isolation can be easily performed in the SOI structure including the pair of source/drain regions 3b having the elevated structure.

The metal silicide films 5 of CoSi are formed on the source/drain regions 3b having the elevated structure, whereby the resistance of the source/drain regions 3b can be further reduced.

A process of fabricating the semiconductor device according to the first embodiment is now described with reference to FIGS. 1 to 8.

Figure 2:
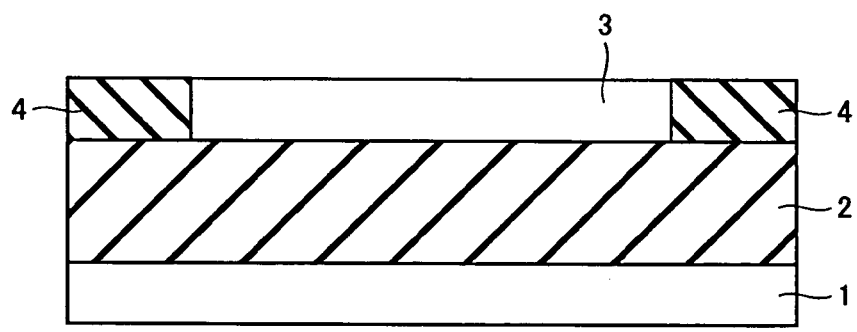
FIGS. 2 to 8 are sectional views for illustrating a process of fabricating the semiconductor device according to the first embodiment shown in FIG. 1.

First, an SOI substrate is prepared by forming the single-crystalline silicon layer 3 on the silicon substrate 1 through the embedded oxide film 2, as shown in FIG. 2. Portions of the single-crystalline silicon layer 3 positioned on element isolation regions are removed by photolithography and dry etching, and an SiN film (not shown) is thereafter formed with a thickness of about 150 nm. Excess depositional portions of the SiN film are removed by CMP (chemical mechanical polishing) or an etch-back method, thereby forming the element isolation insulator films 4 of SiN as shown in FIG. 2.

Figure 3:
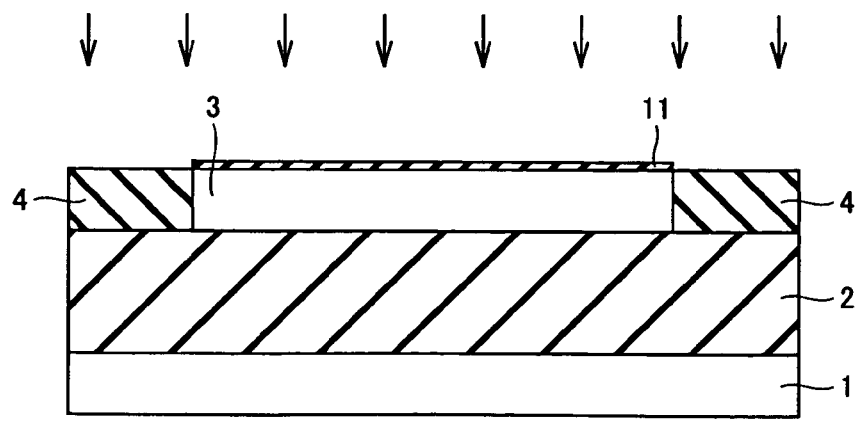

As shown in FIG. 3, a silicon oxide film 11 is formed on the surface of the single-crystalline silicon layer 3 by thermal oxidation. Arsenic (As) ions are implanted into the single-crystalline silicon layer 3 through the silicon oxide film 11 under conditions of injection energy of about 10 keV and an injection rate of about $1 \times 10^{15}$ $cm^{-2}$, and heat treatment is thereafter performed at about 1000° C. for about 10 seconds, thereby diffusing and electrically activating the implanted impurity. Thereafter the silicon oxide film 11 is removed with dilute hydrofluoric acid or buffered hydrofluoric acid.

Figure 4:
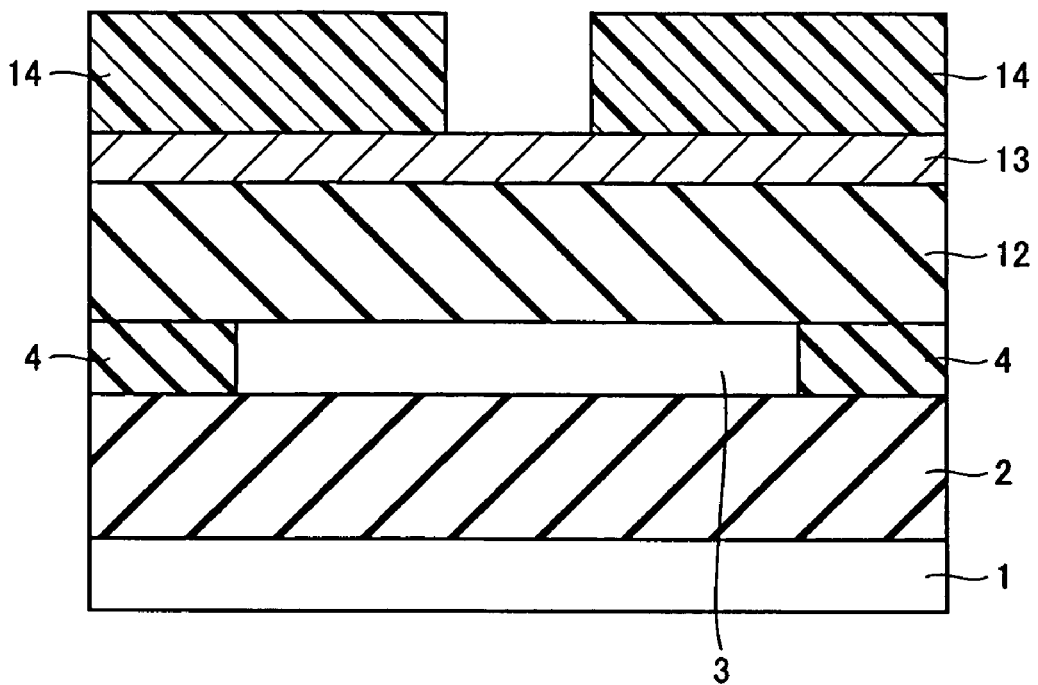
Figure 5:
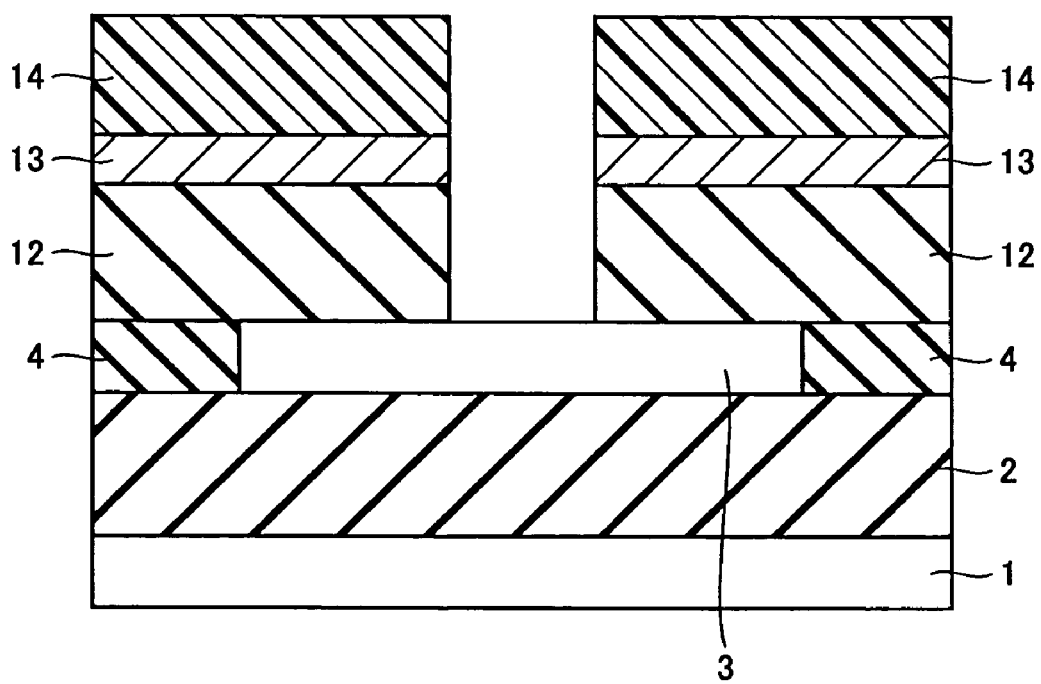

As shown in FIG. 4, another silicon oxide film 12 is deposited by CVD to cover the overall surface with a thickness of about 200 nm. A polysilicon film 13 is deposited on the silicon oxide film 12 by CVD with a thickness of about 70 nm. Resist films 14 are deposited on prescribed regions of the polysilicon film 13. The resist films 14 are employed as masks for dry-etching the polysilicon film 13 and the silicon oxide film 12, thereby forming a trench-type opening shown in FIG. 5. This dry etching is controlled to automatically stop through the etching time and the difference between the selection ratios for the silicon oxide film 12 and the single-crystalline silicon layer 3. Therefore, the single-crystalline silicon layer 3 is hardly cut. Thereafter the resist film 14 is removed.

Figure 6:
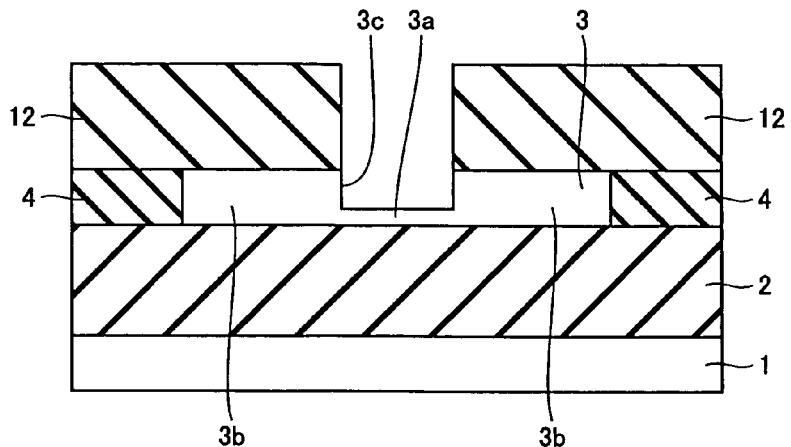

Then, the polysilicon film 13 and the silicon oxide film 12 are employed as masks for dry-etching the single-crystalline silicon layer 3. At this time, the polysilicon film 13 located on the silicon oxide film 12 is also simultaneously etched. In this case, the silicon oxide film 12 located under the etched polysilicon film 13 having the thickness of about 70 nm is exposed to change an emission waveform of plasma. The etching is stopped by detecting this change of the emission waveform. Thus, the single-crystalline silicon layer 3 has the recess portion 3c as shown in FIG. 6. Assuming that polysilicon and single-crystalline silicon have identical etching rates for the purpose of simplification, the single-crystalline silicon layer 3 is etched by a thickness of about 70 nm, to result in the thickness of about 30 nm of the channel region 3a. Thereafter the exposed surface of the recess portion 3c of the single-crystalline silicon layer 3 is thermal oxidized by a thickness of about 10 nm thereby forming a silicon oxide film (not shown), which in turn is removed with dilute hydrofluoric acid or buffered hydrofluoric acid.

Figure 7:
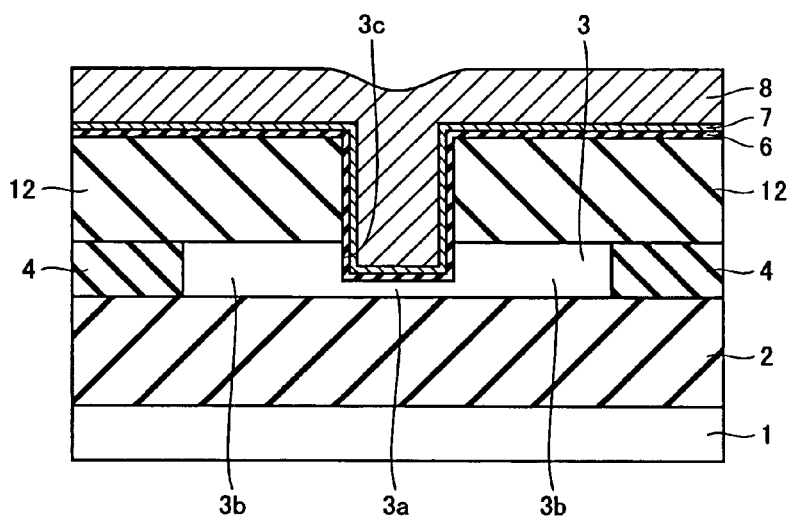
Figure 8:
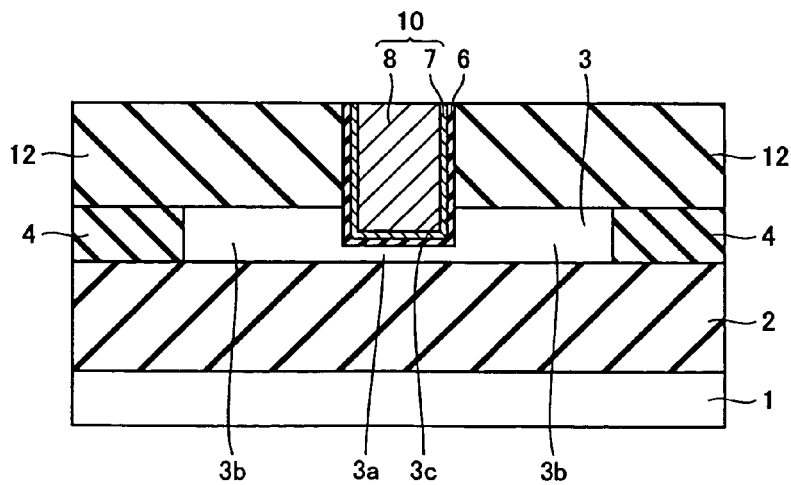

As shown in FIG. 7, the $HfO_2$ film (high dielectric constant insulator film) is deposited on the overall surface of the silicon oxide film 12 including the recess portion 3c by CVD or sputtering with the thickness of about 1 nm in terms of an $SiO_2$ film, thereby forming the gate insulator film 6. The Hf film 7 having the work function controlled to a substantially constant value of about 3.9 eV is deposited on the gate insulator film 6 with the thickness of about 10 nm under an extremely low temperature condition of not more than −100° C., for example, causing no surface reaction on the interface between the Hf film 7 and the gate insulator film 6. Thereafter the TaN film 8 is formed by sputtering or CVD to fill up the region enclosed with the Hf film 7. Thereafter excess depositional portions of the TaN film 8, the Hf film 7 and the gate insulator film 6 are removed by CMP, thereby obtaining the flattened shape shown in FIG. 8. Thereafter the silicon oxide film 12 is removed by dry etching.

Finally, a silicon oxide film (not shown) is formed by CVD with a thickness of about 50 nm and anisotropically etched thereby forming the side wall insulator films 9 of silicon oxide, as shown in FIG. 1. Thereafter a Co film is deposited on the overall surface by sputtering and thereafter heat-treated thereby forming the metal silicide films (CoSi films) 5 on the surfaces of the source/drain regions 3b. The semiconductor device according to the first embodiment is formed in the aforementioned manner. Thereafter an interlayer dielectric film (not shown) and wiring portions (not shown) are formed.

SECOND EMBODIMENT

Figure 9:
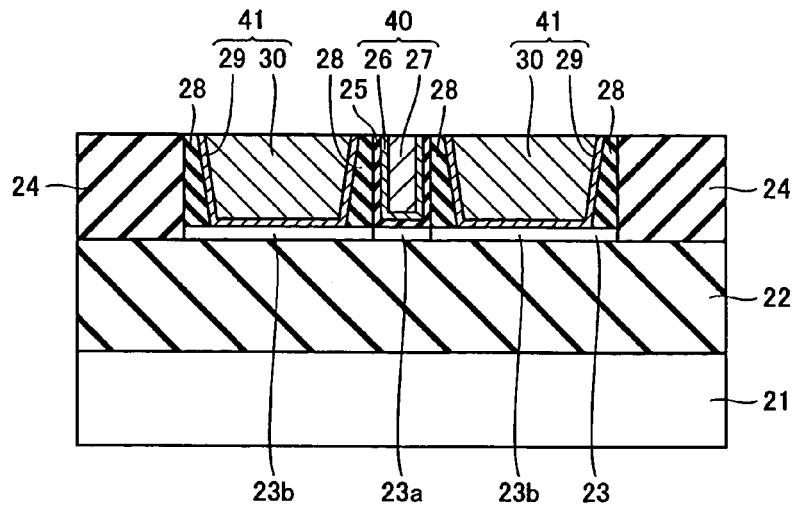
FIG. 9 is a sectional view showing a semiconductor device according to a second embodiment of the present invention.

Referring to FIG. 9, sources/drains of an elevated structure are formed by a single-crystalline silicon layer and metal layers in a semiconductor device according to a second embodiment of the present invention, dissimilarly to the aforementioned embodiment.

More specifically, an embedded oxide film 22 is formed on a silicon substrate 21 in the semiconductor device according to the second embodiment. A single-crystalline silicon layer 23 serving as an SOI layer having a thickness of about 30 nm is formed on a prescribed region of the embedded oxide film 22. The single-crystalline silicon layer 23 is an example of the "silicon region" or the "silicon layer" in the present invention. The single-crystalline silicon layer 23 is formed with n-type source/drain regions 23b to hold a channel region 23a therebetween at a prescribed interval. A gate insulator film 25 consisting of a U-shaped $HfO_2$ film (high dielectric constant insulator film) is formed on the channel region 23a to have a thickness of about 1 nm in terms of an $SiO_2$ film. An Hf film 26 having a work function controlled to about 3.9 eV is formed along the inner surface of the U-shaped gate insulator film 25 with a thickness of about 10 nm. A TaN film 27 having a larger thickness than the Hf film 26 is formed to fill up a region enclosed with the U-shaped Hf film 26.

The Hf film 26 is an example of the "first metal layer" in the present invention, and the TaN film 27 is an example of the "second metal layer" in the present invention. The Hf film 26 and the TaN film 27 constitute a metal gate 40. The metal gate 40 is an example of the "gate electrode" in the present invention. The pair of source/drain regions 23b, the gate insulator film 25 and the metal gate 40 constitute a MOS field-effect transistor having an SOI structure.

Element isolation insulator films 24 of SiN are formed with a thickness of about 190 nm to enclose an element forming region while reaching the embedded oxide film 22. Side wall insulator films 28 of silicon oxide are formed on both side surfaces of the gate insulator film 25 and the side surfaces of the element isolation insulator films 24 closer to the element forming region respectively.

According to the second embodiment, Hf films 29 having a work function controlled to about 3.9 eV are formed with a thickness of about 10 nm to come into contact with the n-type source/drain regions 23b along the side surfaces of the side wall insulator films 28. These Hf films 29 are formed on the surfaces of the n-type source/drain regions 23b to be directly in contact with these surfaces without interposition of metal silicide films or the like. TaN films 30 having a larger thickness than the Hf films 29 are formed to fill up regions enclosed with the Hf films 29. The Hf films 29 having the controlled work function and the TaN films 30 having an uncontrolled work function form source/drain electrodes 41.

According to the second embodiment, the source/drain regions 23b consisting of the single-crystalline silicon layer 23 and the Hf and TaN films 29 and 30, which are metal films, constitute the sources/drains of the elevated structure. The Hf films 29 are examples of the "third metal layers" in the present invention, and the TaN films 30 are examples of the "fourth metal layers" in the present invention.

According to the second embodiment, as hereinabove described, the Hf films 29 having the work function controlled to about 3.9 eV are provided on the source/drain regions 23b consisting of the single-crystalline silicon layer 23 to be in contact with the source/drain regions 23b without interposition of metal silicide films or the like so that the semiconductor device can bring the source/drain regions 23b and the source/drain electrodes 41 into ohmic contact through extremely low-resistance junctions also when the n-type source/drain regions 23b have low impurity concentrations. Thus, the semiconductor device can further reduce the resistance of the sources/drains consisting of the source/drain regions 23b and the source/drain electrodes 41 while suppressing a short channel effect with the source/drain regions 23b having low impurity concentrations also when the semiconductor device is refined. Further, the impurity concentration of the channel region 23a can be reduced due to the suppressed short channel effect, whereby the threshold voltage can be reduced.

In addition, the source/drain electrodes 41 constituted of the thin Hf films 29 of about 10 nm in thickness having the controlled work function and the TaN films 30, which are conventional source/drain electrode materials, having the larger thickness than the Hf films 29 can be more easily fabricated as compared with a case of forming the source/drain electrodes 41 only by the Hf films 29 having the controlled work function requiring a relatively complicated fabrication process.

According to the second embodiment, further, the Hf film 26 having the work function controlled to about 3.9 eV is so provided on the gate insulator film 25 that the Hf film 26 can be inhibited from pinning on the interface between the metal gate 40 including the Hf film 26 and the gate insulator film 25 similarly to the aforementioned first embodiment, whereby the threshold voltage can be inhibited from increase also when the metal gate 40 consists of a metal.

The remaining effects of the second embodiment are similar to those of the aforementioned first embodiment.

A process of fabricating the semiconductor device according to the second embodiment is now described with reference to FIGS. 9 to 19.

Figure 10:
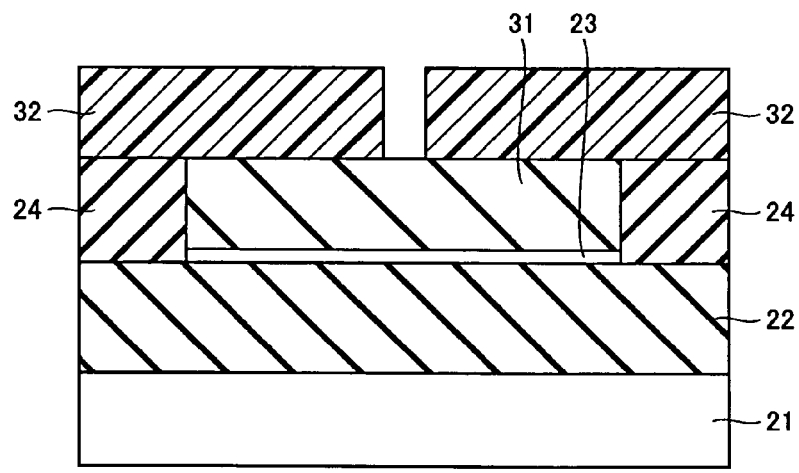
FIGS. 10 to 19 are sectional views for illustrating a process of fabricating the semiconductor device according to the second embodiment shown in FIG. 9.

As shown in FIG. 10, the embedded oxide film 22 is formed on the silicon substrate 21. A single-crystalline silicon layer (not shown) having a thickness of about 100 nm is formed on the embedded oxide film 22 and thereafter thermally oxidized, thereby forming a silicon oxide film 31 having a thickness of about 160 nm and the single-crystalline silicon layer 23 having the thickness of about 30 nm. Thereafter portions of the silicon oxide film 31 and the single-crystalline silicon layer 23 located on element isolation regions are removed by photolithography and dry etching. An SiN film (not shown) is deposited with a thickness of about 250 nm and thereafter flattened by CMP or an etch-back method, thereby forming the element isolation insulator films 24 of SiN as shown in FIG. 10. Thereafter a resist film 32 having a trench opening pattern is formed on prescribed regions of the silicon oxide film 31 and the element isolation insulator films 24.

Figure 11:
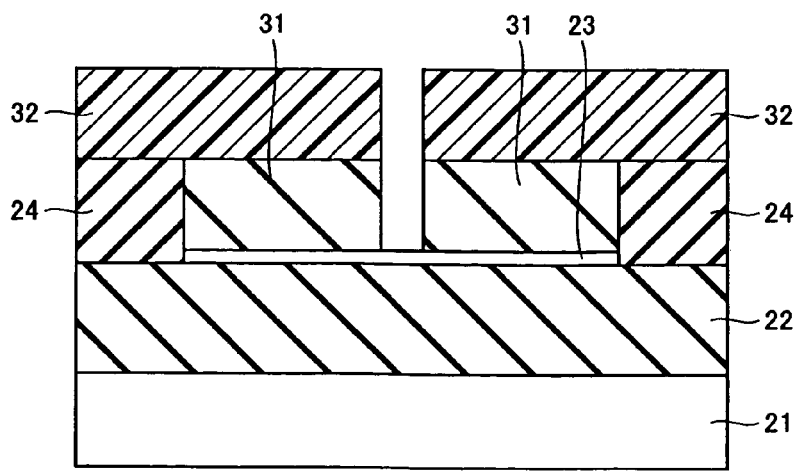

The resist film 32 is employed as a mask for dry-etching the silicon oxide film 31, thereby working the silicon oxide film 31 in the form of a trench as shown in FIG. 11. This dry etching is controlled to automatically stop through the etching time and the difference between the selection ratios for the silicon oxide film 31 and the single-crystalline silicon layer 23. Therefore, the single-crystalline silicon layer 23 is hardly cut. Thereafter the resist film 32 is removed. The exposed surface of the single-crystalline silicon layer 23 is thermally oxidized for forming a silicon oxide film (not shown) having a thickness of about 10 nm, and this silicon oxide film is thereafter removed with dilute hydrofluoric acid or buffered hydrofluoric acid.

Figure 12:
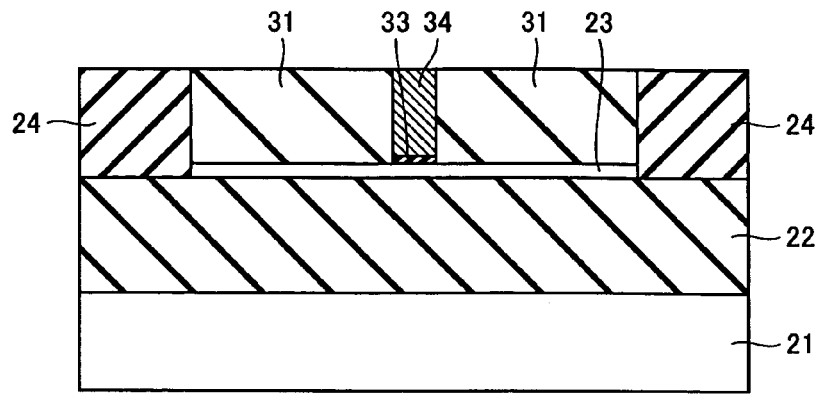

As shown in FIG. 12, another silicon oxide film 33 having a thickness of about 10 nm is formed on the exposed surface of the single-crystalline silicon layer 23 by thermal oxidation, and a polysilicon film 34 having a thickness of about 100 nm is thereafter deposited to fill up the trench. Excess depositional portions of the polysilicon film 34 are removed by CMP. At this time, the silicon nitride films (SiN films) constituting the element isolation insulator films 24 function as stopper films. Thereafter the silicon oxide film 31 is removed by dry etching.

Figure 13:
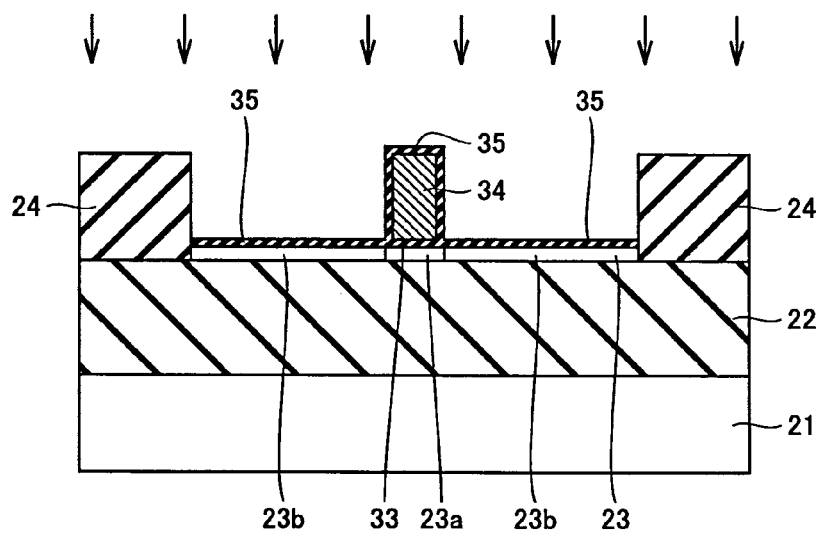
Figure 14:
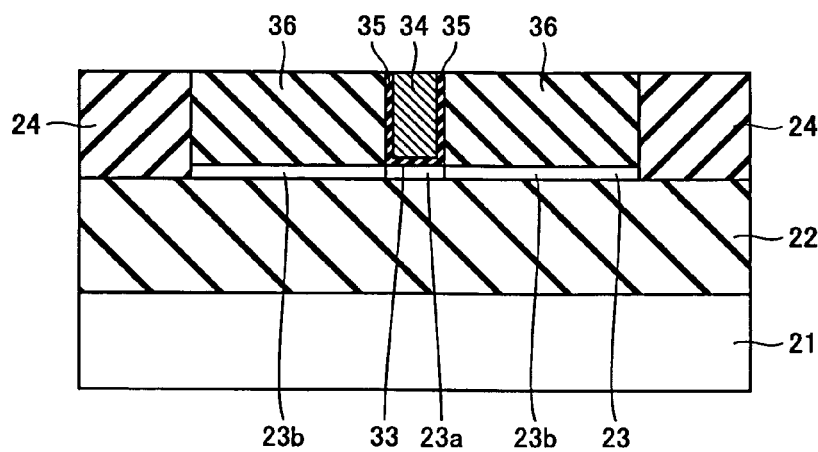

As shown in FIG. 13, another silicon oxide film 35 having a thickness of about 10 nm is deposited on the surface of the single-crystalline silicon layer 23 and the upper and side surfaces of the polysilicon film 34 by thermal oxidation, and arsenic (As) ions are thereafter implanted into the single-crystalline silicon layer 23 under conditions of injection energy of about 15 keV and an injection rate of about $5 \times 10^{14}$ cm$^{-2}$. Thereafter heat treatment is performed at about 1000° C. for about 10 seconds, thereby diffusing and electrically activating the implanted arsenic (As). Thus, the n-type source/drain regions 23$b$ are formed to hold the channel region 23$a$ therebetween. Thereafter still another silicon oxide film 36 is deposited by CVD with a thickness of about 200 nm and excess depositional portions thereof are removed by CMP, thereby obtaining the shape shown in FIG. 14.

Figure 15:
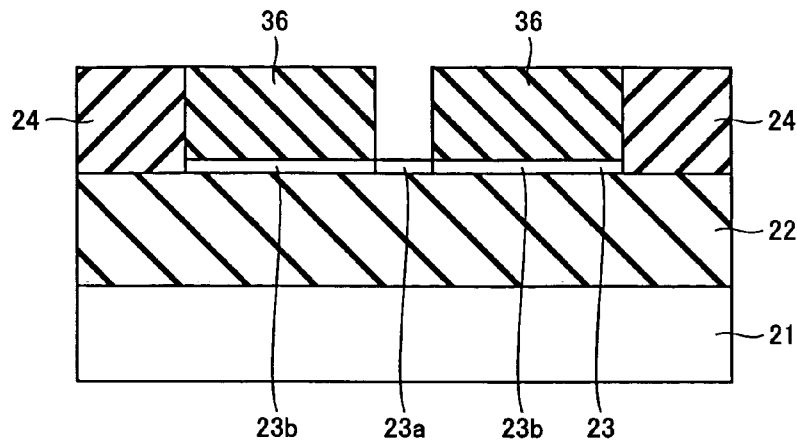

The polysilicon film 34 is removed by dry etching, and the silicon oxide films 33 and 35 located on the bottom and side surfaces respectively are thereafter removed, thereby exposing the surface of the channel region 23$a$ as shown in FIG. 15.

Figure 16:
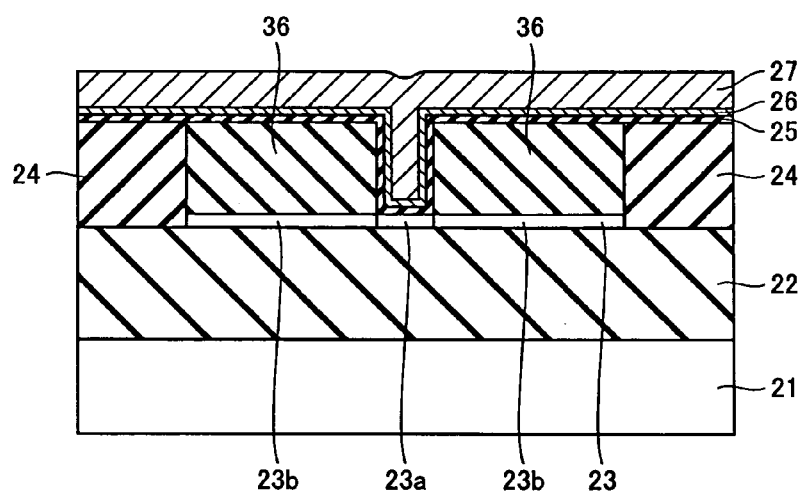
Figure 17:
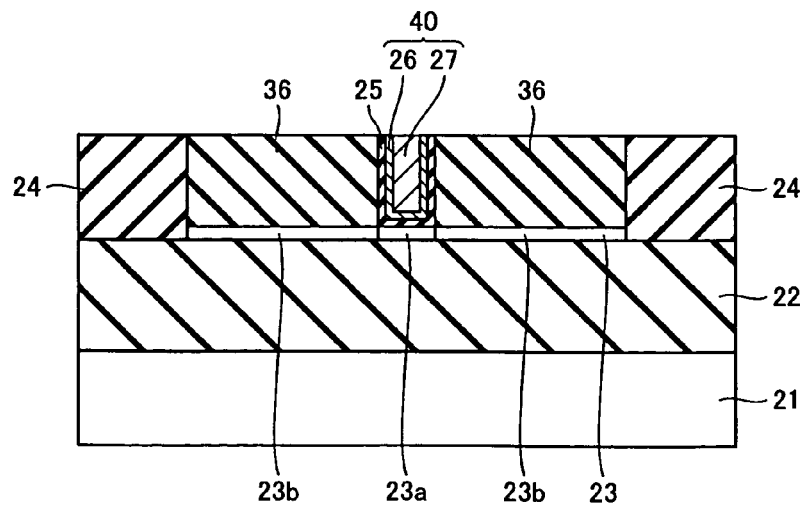

As shown in FIG. 16, the gate insulator film 25 consisting of the HfO$_2$ film employed as a high dielectric constant insulator film is formed by CVD or sputtering with the thickness of about 1 nm in terms of an SiO$_2$ film. The Hf film 26 having the work function controlled to the substantially constant value of about 3.9 eV is deposited along the surface of the gate insulator film 25 by sputtering with the thickness of about 10 nm under the extremely low temperature condition of not more than −100° C., for example, causing no surface reaction on the interface between the Hf film 26 and the gate insulator film 25.

Figure 18:
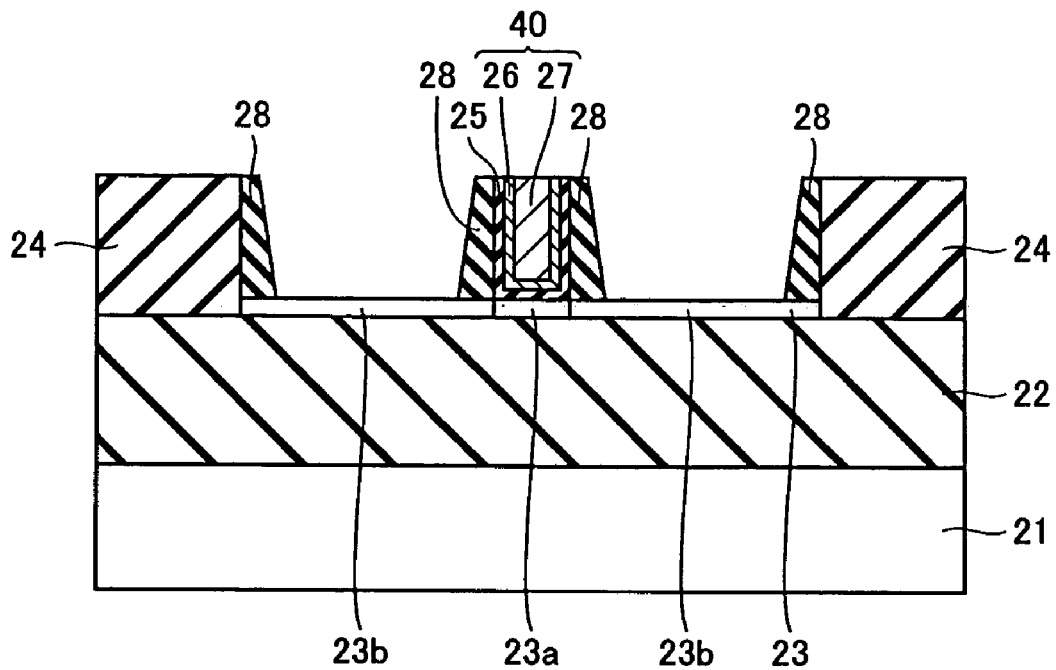

Thereafter the TaN film 27 is formed by sputtering or CVD to fill up the trench of the Hf film 26. Thereafter excess depositional portions of the TaN film 27, the Hf film 26 and the gate insulator film 25 are removed by CMP, thereby obtaining a flat shape shown in FIG. 17. Thereafter the silicon oxide film 36 is removed by dry etching. A silicon oxide film (not shown) is deposited on the overall surface by CVD with a thickness of about 50 nm and thereafter anisotropically etched, thereby forming the side wall insulator films 28 of silicon oxide as shown in FIG. 18.

Figure 19:
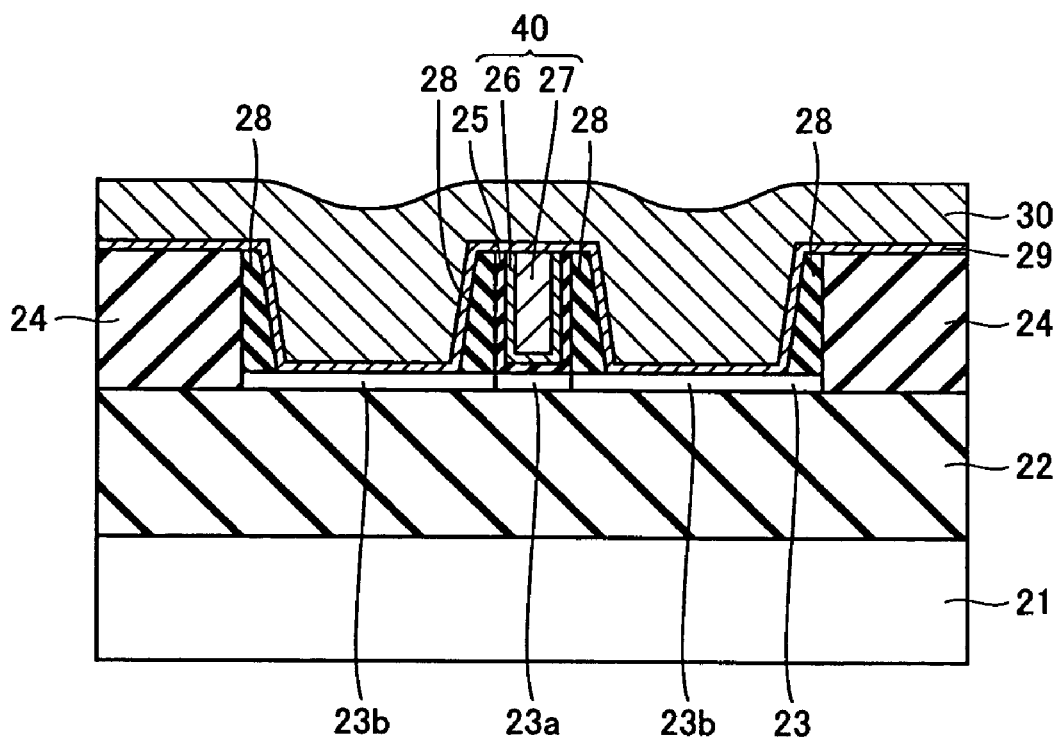

As shown in FIG. 19, the Hf films 29 having the work function controlled to the substantially constant value of about 3.9 eV are deposited by sputtering with the thickness of about 10 nm to cover the overall surface in the state coming into contact with the surfaces of the source/drain regions 23$b$ of the single-crystalline silicon layer 23 under the extremely low temperature condition of not more than −100° C., for example, causing no surface reaction on the interface between the Hf films 29 and the source/drain regions 23$b$. The TaN films 30 are deposited by sputtering or CVD with a thickness of about 200 nm to cover the regions enclosed with the Hf films 29. Thereafter excess depositional portions of the TaN films 30 and the Hf films 29 are cut by CMP to electrically isolate the metal gate 40 from the TaN films 30 and the Hf films 29 forming the source/drain electrodes 41. Thus, the semiconductor device according to the second embodiment is formed as shown in FIG. 9. Thereafter an interlayer dielectric film (not shown) and wiring portions (not shown) are formed.

THIRD EMBODIMENT

Figure 20:
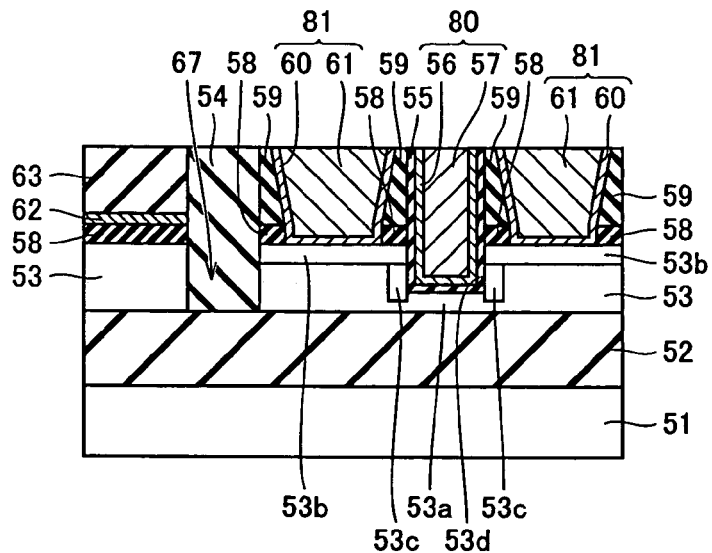
FIG. 20 is a sectional view showing a semiconductor device according to a third embodiment of the present invention.

Referring to FIG. 20, source/drain electrodes 81 having a controlled work function are directly formed on source/drain regions 53$b$ of an elevated structure consisting of a single-crystalline silicon layer 53 similar to that shown in FIG. 1 in a semiconductor device according to a third embodiment of the present invention. In other words, the semiconductor device according to the third embodiment has a structure obtained by combining those of the semiconductor devices according to the first and second embodiments shown in FIGS. 1 and 9 respectively.

More specifically, an embedded oxide film 52 is formed on a silicon substrate 51 in the semiconductor device according to the third embodiment. The single-crystalline silicon layer 53 having a thickness of about 100 nm is formed on the embedded oxide film 52. The single-crystalline silicon layer 53 is an example of the "silicon region" or the "silicon layer" in the present invention. An element isolation insulator film 54 of silicon oxide is formed on an element isolation region to reach the embedded oxide film 52. Extension regions 53$c$ consisting of n-type low-concentration impurity regions are formed in the single-crystalline silicon layer 53 to hold a channel region 53$a$ therebetween. The n-type source/drain regions 53$b$ are formed in continuation with the extension regions 53$b$.

A recess portion 53$d$ is formed on the channel region 53$a$ of the single-crystalline silicon layer 53. Thus, the source/drain regions 53$b$ and the extension regions 53$b$ are lifted up with respect to the channel region 53$a$ in the elevated structure. A gate insulator film 55 consisting of an HfO$_2$ film (high dielectric constant insulator film) having a U shape formed along the surface of the recess portion 53$d$ is formed on the channel region 53$a$. The HfO$_2$ film constituting the gate insulator film 55 has a thickness of about 1 nm in terms of an SiO$_2$ film.

An Hf film 56 of about 10 nm in thickness having a work function controlled to about 3.9 eV is formed along the inner surface of the U-shaped gate insulator film 55. A TaN film 57 having a larger thickness than the Hf film 56 is formed to fill up a region enclosed with the U-shaped Hf film 56. The Hf film 56 having the controlled work function and the TaN film 57 having an uncontrolled work function constitute a metal gate 80. The pair of source/drain regions 53$b$, the pair of extension regions 53$c$, the gate insulator film 55 and the metal gate 80 constitute a MOS field-effect transistor having an SOI structure. The Hf film 56 is an example of the "first metal layer" in the present invention, and the TaN film 57 is an example of the "second metal layer" in the present invention. The metal gate 80 is an example of the "gate electrode" in the present invention. Silicon oxide films 58 and side wall insulator films 59 of silicon oxide are formed on the side surfaces of the U-shaped gate insulator film 55 and the element isolation insulator film 54.

Hf films 60 of about 10 nm in thickness having a work function controlled to about 3.9 eV are formed to come into contact with the source/drain regions 53$b$ in regions enclosed with the silicon oxide films 58 and the side wall insulator films 59. TaN films 61 are formed to fill up regions enclosed with the Hf films 60. The Hf films 60 having the controlled work function and the TaN films 61 constitute the source/drain electrodes 81. The Hf films 60 are examples of the "third metal layers" in the present invention, and the TaN films 61 are examples of the "fourth metal layers" in the present invention.

According to the third embodiment, as hereinabove described, the source/drain regions 53b and the extension regions 53c consisting of the single-crystalline silicon layer 53 are lifted up with respect to the channel region 53a in the elevated structure, whereby the resistance of the source/drain regions 53b can be reduced while reducing the thickness of the channel region 53a. Further, the source/drain electrodes 81 including the Hf films 60 having the work function controlled to have a Fermi level around the energy level of the conduction band of silicon constituting the n-type source/drain regions 53b are provided to be in contact with the surfaces of the source/drain regions 53b having the elevated structure, whereby the source/drain regions 53b and the source/drain electrodes 81 can be brought into ohmic contact through extremely low-resistance junctions also when the source/drain regions 53b have low impurity concentrations. Thus, the resistance of sources/drains constituted of the source/drain regions 53b and the extension regions 53c of silicon as well as the Hf films 60 and the TaN films 61 of metals can be further reduced, and a short channel effect can be suppressed with the source/drain regions 53b having low impurity concentrations also when the semiconductor device is refined. Further, the impurity concentration of the channel region 53a can be reduced due to the suppressed short channel effect, whereby the threshold voltage can be reduced.

According to the third embodiment, as hereinabove described, the metal gate 80 including the Hf film 56 having the work function controlled to have a Fermi level around the energy level of the conduction band of silicon constituting the n-type source/drain regions 53b is provided on the channel region 53a through the gate insulator film 55 consisting of the high dielectric insulator film ($HfO_2$ film) so that the Hf film 56 can be inhibited from pinning on the interface between the metal gate 80 and the gate insulator film 55, whereby the threshold voltage can be inhibited from increase despite employment of the metal gate 80.

Further, the metal gate 80, constituted of the thin Hf film 56 of about 10 nm having the controlled work function and the TaN film 57, which is a conventional metal gate material, having the larger thickness than the Hf film 56 can be more easily fabricated as compared with a case of forming the metal gate 80 only by the Hf film 56 having the controlled work function requiring a relatively complicated fabrication process.

In addition, the source/drain electrodes 81, constituted of the Hf films 60 having the small thickness of about 10 nm with the controlled work function and the TaN films 61, which are conventional source/drain electrode materials, having the larger thickness than the Hf films 60 can be more easily fabricated as compared with a case of forming the source/drain electrodes 81 only by the Hf films 60 having the controlled working function requiring a relatively complicated fabrication process.

The semiconductor device according to the third embodiment can be on-off controlled with a low gate voltage due to the channel region 53a, having a small thickness, consisting of the single-crystalline silicon layer 53 of the SOI structure. Thus, the probability of jamming electrons to the interface between the gate insulator film 55 and the single-crystalline silicon layer 53 is so reduced that influence by interfacial scattering can be reduced. Consequently, electron mobility can be increased thereby improving the working speed.

A process of fabricating the semiconductor device according to the third embodiment is described with reference to FIGS. 20 to 33.

Figure 21:
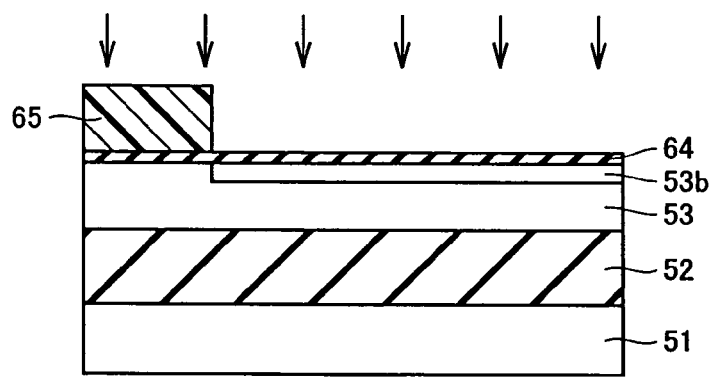
FIGS. 21 to 33 are sectional views for illustrating a process of fabricating the semiconductor device according to the third embodiment shown in FIG. 20.

As shown in FIG. 21, the embedded oxide film 52 is formed on the silicon substrate 51. The single-crystalline silicon layer 53 having the thickness of about 100 nm is formed on the embedded oxide film 52. The surface of the single-crystalline silicon layer 53 is thermally oxidized thereby forming a silicon oxide film 64 having a thickness of about 5 nm. A resist film 65 is formed on a prescribed region of the silicon oxide film 64. This resist film 65 is employed as a mask for implanting arsenic (As) ions into the single-crystalline silicon layer 53 under conditions of injection energy of about 15 keV and an injection rate of about $1 \times 10^{15}$ cm$^{-2}$. Thereafter heat treatment is performed at about 1000° C. for about 10 seconds, thereby diffusing and electrically activating the implanted impurity (As). Thus, the n-type source/drain regions 53b are formed. Thereafter the resist film 65 is removed. Further, the silicon oxide film 64 is removed with dilute hydrofluoric acid or buffered hydrofluoric acid.

Figure 22:
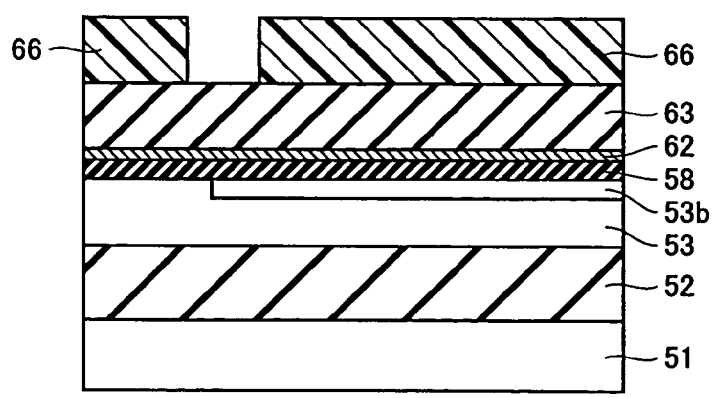

As shown in FIG. 22, another silicon oxide film 58 is formed by thermal oxidation. A polysilicon film 62 having a thickness of about 50 nm is formed on the silicon oxide film 58 by CVD. A silicon nitride film 63 is formed on the polysilicon film 62. Other resist films 66 are formed on prescribed regions of the silicon nitride film 63.

Figure 23:
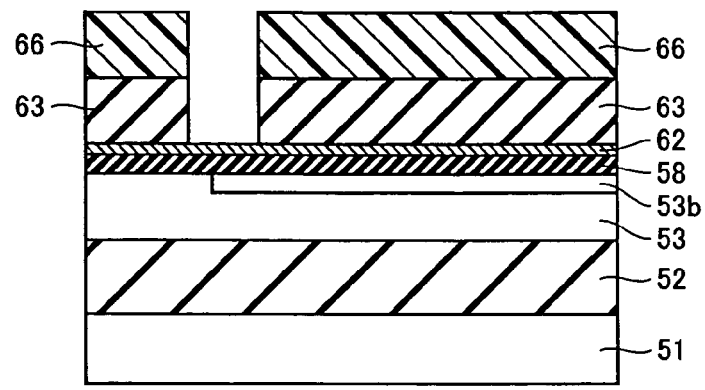

As shown in FIG. 23, the resist films 66 are employed as masks for etching the silicon nitride film 63 in the form of a trench. Thereafter the resist films 66 are removed.

Figure 24:
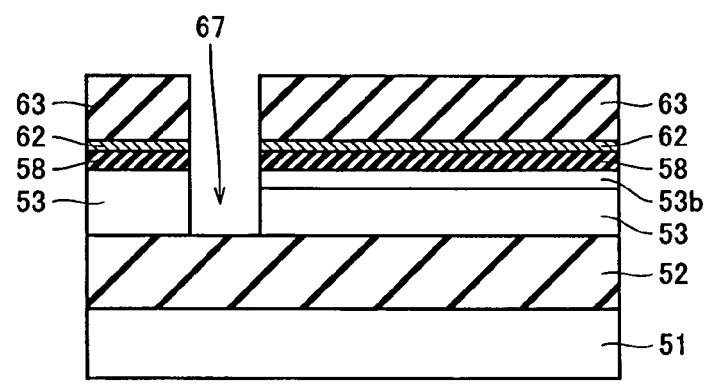

As shown in FIG. 24, the silicon nitride film 63 worked in the form of a trench is employed as a mask for dry-etching the polysilicon film 62, the silicon oxide film 58 and the single-crystalline silicon layer 53. Thus, a trench-shaped opening 67 is formed.

Figure 25:
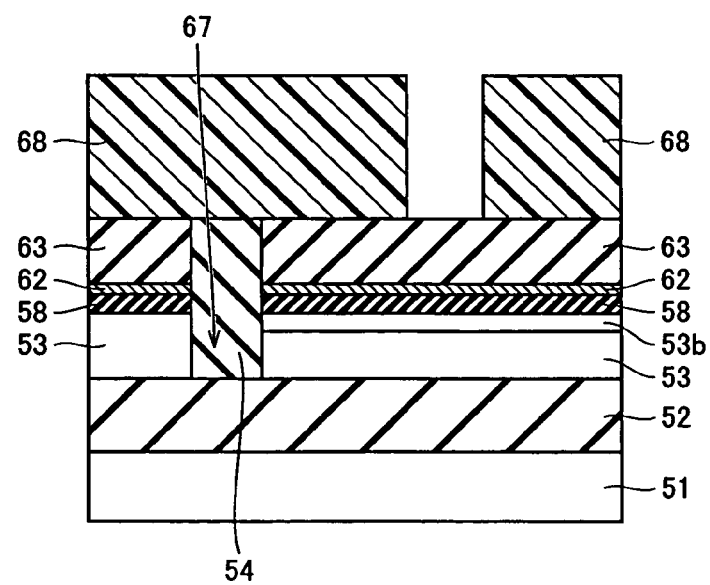
Figure 26:
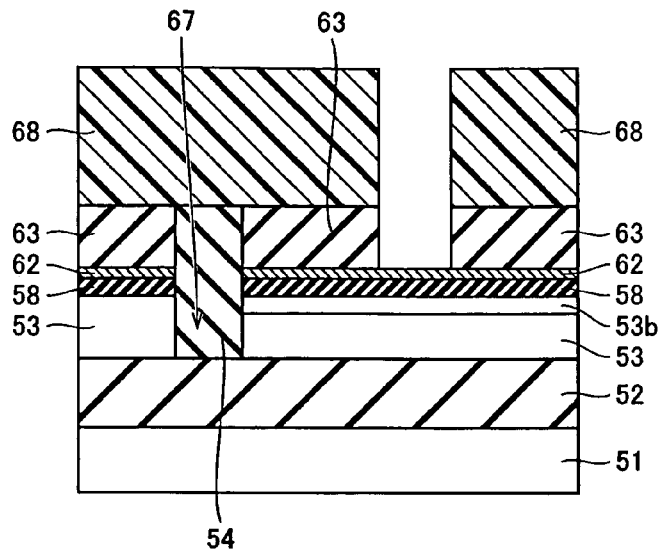

As shown in FIG. 25, the element isolation insulator film 54 of silicon oxide is formed to fill up the trench-shaped opening 67. Thereafter a further resist film 68 having a trench-shaped opening is formed on prescribed regions of the silicon nitride film 63 and the element isolation insulator film 54. The resist film 68 having the trench-shaped opening is employed as a mask for dry-etching the silicon nitride film 63, thereby working the silicon nitride film 63 in the form of a trench as shown in FIG. 26. Thereafter the resist film 68 is removed.

Figure 27:
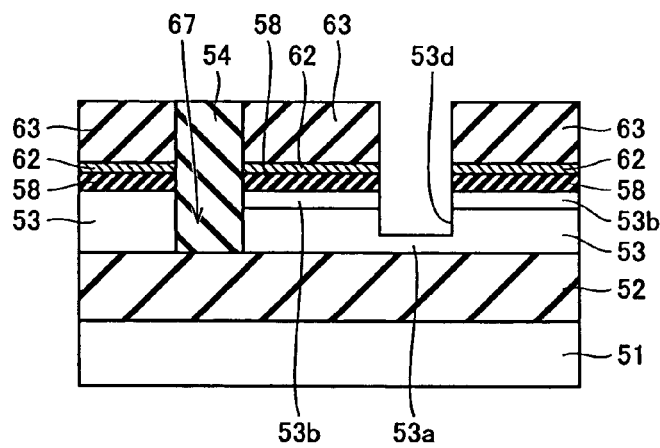

As shown in FIG. 27, the silicon nitride film 63 worked in the form of a trench is employed as a mask for partially dry-etching the polysilicon film 62, the silicon oxide film 58 and the single-crystalline silicon layer 53 up to an intermediate portion of the single-crystalline silicon layer 53. In this case, an end point of the etching is detected from the emission waveform of plasma when the silicon oxide film 58 located under the polysilicon film 62 is exposed, thereby temporarily stopping the etching. A time necessary for etching the single-crystalline silicon layer 53 by about 70 nm is estimated from a time T1 required for etching the polysilicon film 62 having the thickness of about 50 nm. Assuming that polysilicon and single-crystalline silicon have identical etching rates for the purpose of simplification, a time of 1.4 T is necessary for etching the single-crystalline silicon layer 53 by about 70 nm. Therefore, the single-crystalline silicon layer 53 can be etched by about 70 nm by removing the silicon oxide film 58 by etching and thereafter etching the single-crystalline silicon layer 53 by the time 1.4

T. Thus, the recess portion 53*d* is formed in the single-crystalline silicon layer 53. The pair of n-type source/drain regions 53*b* are formed to hold the channel region 53*a* therebetween due to the formation of the recess portion 53*d*.

Figure 28:
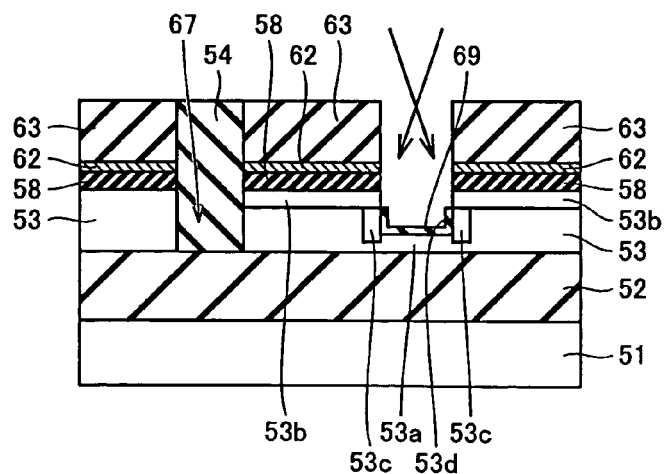

As shown in FIG. 28, still another silicon oxide film 69 is formed by thermal oxidation along the surface of the recess portion 53*d* of the single-crystalline silicon layer 53 with a thickness of about 5 nm. Arsenic (As) ions are obliquely implanted into the inner side surfaces of the recess portion 53*d* of the single-crystalline silicon layer 53 with inclination of 20° to 30° under conditions of injection energy of about 15 keV and an injection rate of about $1 \times 10^{14}$ cm$^{-2}$, thereby forming the n-type extension regions 53*c*. In this case, the aspect ratio of an opening subjected to the oblique ion implantation is preferably coincided with the aspect ratio of a portion (not shown) formed with another gate electrode. Thus, similar extension regions can be formed also as to the portion formed with the other gate electrode. Thereafter heat treatment is performed under conditions of about 1000° C. for about 10 seconds, thereby electrically activating the impurity (As). Thereafter the silicon oxide film 69 is removed with dilute hydrofluoric acid or buffered hydrofluoric acid.

Figure 29:
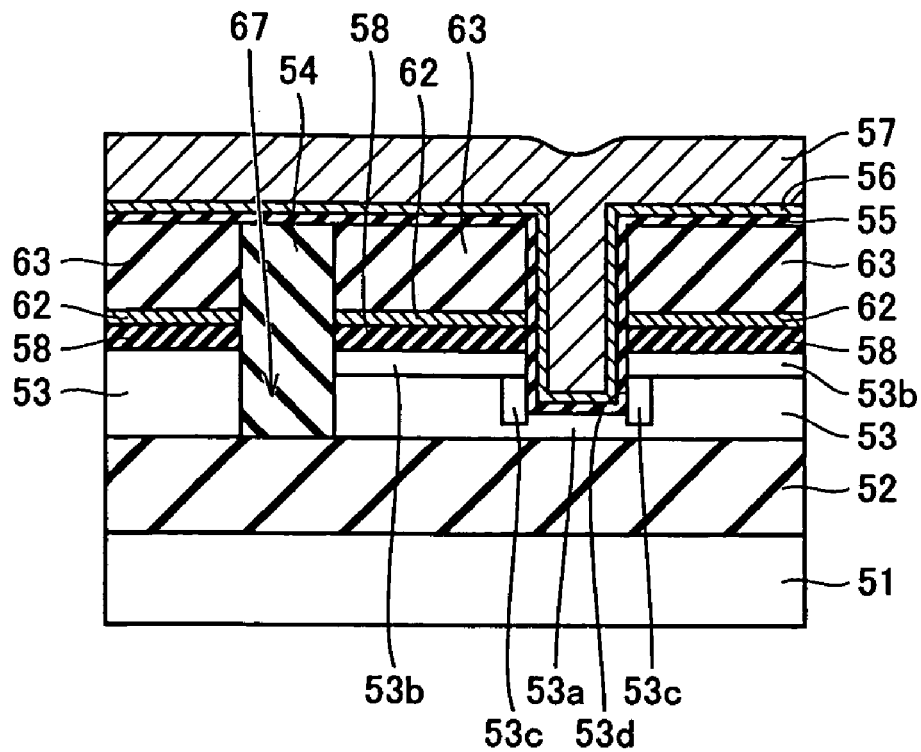

As shown in FIG. 29, the gate insulator film 55 of HfO$_2$ is formed by sputtering or CVD along the upper surface of the channel region 53*a* and the side surfaces of the recess portion 53*d* as well as the upper surface of the silicon nitride film 63. This gate insulator film 55 is formed with the thickness of about 1 nm in terms of an SiO$_2$ film. The Hf film 56 having the work function controlled to the substantially constant value of about 3.9 eV is deposited by sputtering with the thickness of about 10 nm along the surface of the gate insulator film 55 under an extremely low temperature condition of not more than −100° C., for example, causing no surface reaction on the interface between the Hf film 56 and the gate insulator film 55. Thus, the Hf film 56 having the work function controlled to the substantially constant level of about 3.9 eV can be formed.

Figure 30:
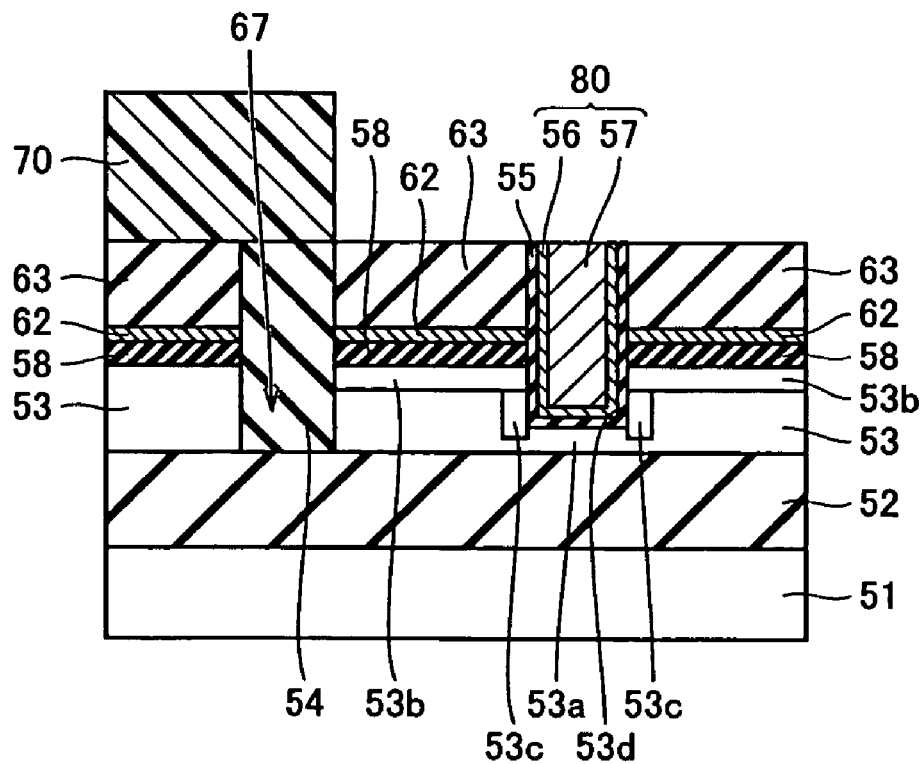
Figure 31:
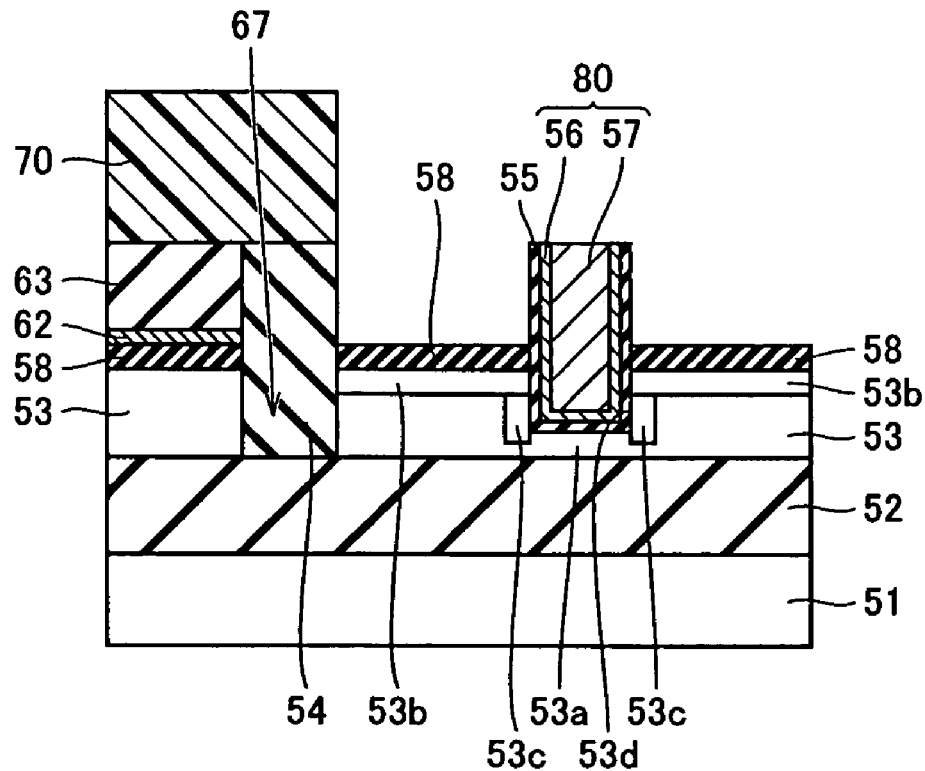

Thereafter the TaN film 57 is formed by sputtering or CVD to fill up a recess region enclosed with the Hf film 56 along the upper surface of the Hf film 56. Excess depositional portions of the TaN film 57, the Hf film 56 and the gate insulator film 55 are removed by CMP, thereby forming the metal gate 80 consisting of the flattened Hf film 56 and the flattened TaN film 57 as shown in FIG. 30. Thereafter a resist film 70 is formed on a prescribed region. The resist film 70 is employed as a mask for removing the silicon nitride film 63 by etching, thereby obtaining the shape shown in FIG. 31. Thereafter the resist film 70 is removed.

Figure 32:
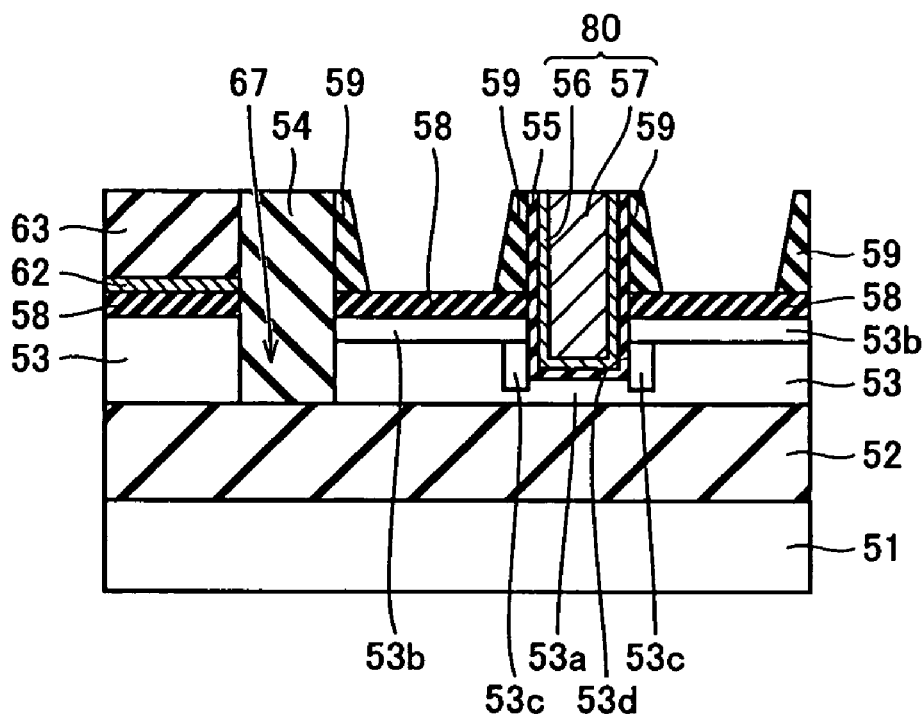

A silicon oxide film is deposited on the overall surface with a thickness of about 50 nm and thereafter anisotropically etched, thereby forming the side wall insulator films 59 of silicon oxide as shown in FIG. 32. In this case, the etching is so performed as not to cut the portions of the silicon oxide film 58 located under the side wall insulator films 59. Thereafter the silicon oxide film 58 is removed with dilute hydrofluoric acid or buffered hydrofluoric acid, thereby exposing the surfaces of the source/drain regions 53*b*.

Figure 33:
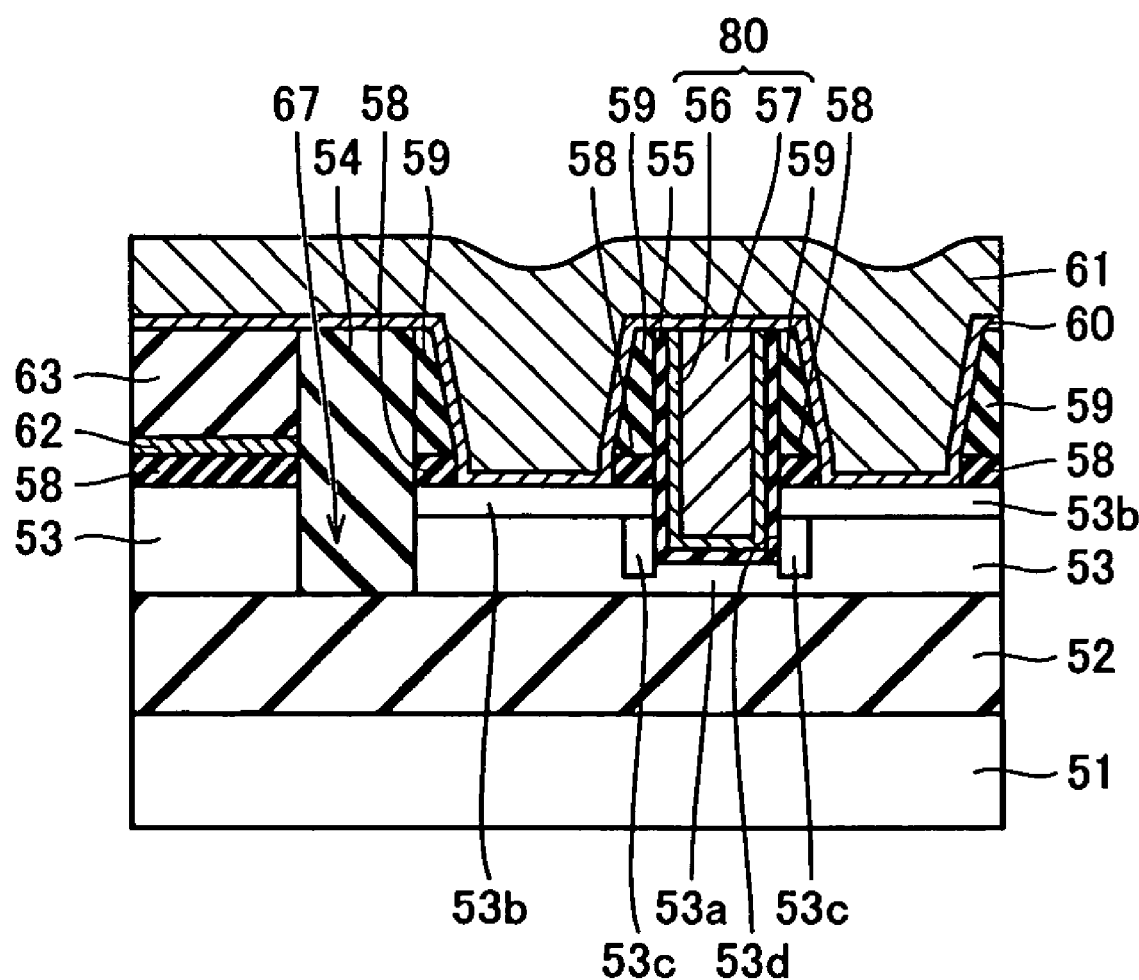

As shown in FIG. 33, the Hf films 60 having the work function controlled to about 3.9 eV are formed by sputtering with the thickness of about 10 nm to be in contact with the source/drain regions 53*b* while covering the overall surface. Thereafter the TaN films 61 are formed by sputtering or CVD to fill up regions enclosed with the Hf films 60. Thereafter excess depositional potions of the TaN films 61 and the Hf films 60 are removed by CMP while electrically isolating the metal gate 80 from the TaN films 61 and the Hf films 60 forming the source/drain electrodes 81. Thus, the semiconductor device according to the third embodiment is formed as shown in FIG. 20. Thereafter an interlayer dielectric film (not shown) and wiring portions (not shown) are formed.

Although the present invention has been described and illustrated in detail, it is clearly understood that the same is by way of illustration and example only and is not to be taken by way of limitation, the spirit and scope of the present invention being limited only by the terms of the appended claims.

For example, while the present invention is applied to a semiconductor device (MOS field-effect transistor) having an SOI structure in each of the aforementioned embodiments, the present invention is not restricted to this but is also applicable to a general semiconductor device (MOS field-effect transistor) formed on a silicon substrate.

While the single-crystalline silicon layer 3, 23 or 53 is employed as an SOI layer in each of the aforementioned embodiments, the present invention is not restricted to this but a similar effect can be attained also when a polycrystalline silicon layer is employed as the SOI layer.

While the present invention is applied to sources/drains having an elevated structure in each of the aforementioned embodiments, the present invention is not restricted to this but is also applicable to unelevated sources/drains.

While the Hf film(s) 7, 26 and 29 or 56 and 60 are employed as metal films having a controlled work function applied to the gate electrode and the source/drain electrodes 41 or 81 of an n-channel MOS field-effect transistor in each of the aforementioned embodiments, the present invention is not restricted to this but metal films having a work function around 4.0 eV close to the conduction band of Si can be employed as metal films having a controlled work function applied to a gate electrode and source/drain electrodes of an n-channel MOS field-effect transistor in place of the Hf film(s) 7, 26 and 29 or 56 and 60. For example, Al films having a work function of 4.28 eV may be employed.

While the present invention is applied to an n-channel MOS field-effect transistor in each of the aforementioned embodiments, the present invention is not restricted to this but is also applicable to a p-channel MOS field-effect transistor. In this case, metal films having a work function of around 5.0 eV close to the valence band of Si are employed as the metal films having a controlled work function in place of the Hf film(s) 7, 26 and 29 or 56 and 60. For example, Ni films having a work function of 5.15 eV or Ir films having a work function of 5.27 eV may be employed. Thus, the Fermi level of the Ni or Ir films is located in the vicinity of the energy level of the valence band of silicon constituting the single-crystalline silicon layer 3, 23 or 53.

While the Hf film 7, 26 or 56 serving as the underlayer of the metal gate 10, 40 or 80 is formed under the extremely low temperature condition of not more than −100° C., for example, in each of the aforementioned embodiments, the Hf film 7, 26 or 56 serving as the underlayer of the metal gate 10, 40 or 80, formed on the gate insulator film 6, 25 or 55, has relatively low surface reactivity with the gate insulator film 6, 25 or 55. Therefore, the Hf film 7, 26 or 56 serving as the underlayer of the metal gate 10, 40 or 80 may not necessarily be formed under the extremely low temperature condition of not more than −100° C. but may alternatively be formed under a temperature not extremely low by general CVD or ALD (atomic layer deposition) allowing deposition at the atomic layer level. In this case, however, there is a possibility of slight surface reaction on the interface between the Hf film 7, 26 or 56 and the gate insulator film 6, 25 or 55, leading to a possibility of slight fluctuation of the work function. Therefore, the material for the Hf film 7, 26 or 56 is preferably selected in consideration of the fluctuation of the work function. For example, a material having a work function slightly smaller than the energy (about 4 eV) of the conduction band of Si is preferably employed for the underlayer of a metal gate of an n-channel MOS field-effect transistor, and a material having a work function slightly larger than the energy (about 5 eV) of the valence band of Si is preferably employed for the underlayer of a metal gate of a p-channel MOS field-effect transistor.

While the Hf film(s) 7, 26 and 29 or 56 and 60 serving as the underlayers for the gate electrode and the source/drain electrodes 41 or 81 are formed by sputtering under the extremely low temperature condition of not more than −100° C., for example, in each of the aforementioned embodiments, the present invention is not restricted to this but the Hf film(s) 7, 26 and 29 or 56 and 60 serving as the underlayers for the gate electrode and the source/drain electrodes 41 or 81 may alternatively be formed by sputtering under the extremely low temperature condition of not more than −100° C. and a high vacuum condition of up to not more than $1 \times 10^6$ Pa, for example.

While the $HfO_2$ film is employed as the high dielectric constant insulator film in each of the aforementioned embodiments, the present invention is not restricted to this but a high dielectric constant film other than the $HfO_2$ film may alternatively be employed for attaining a similar effect. The high dielectric constant film other than the $HfO_2$ film can be prepared from a $ZrO_2$ film or an HfAlO film, for example.

While the TaN film(s) 8, 27, 30, 57 or 61 are employed as the upper layer(s) of the metal gate 10, 40 or 80 or the source/drain electrodes 41 or 81 in each of the aforementioned embodiments, the present invention is not restricted to this but the upper layer(s) may alternatively consist of another material employed for a general metal gate. For example, the TaN film(s) 8, 27, 30, 57 or 61 may be replaced with TiN film(s).

While the plane orientation of the silicon substrate 1, 21 or 51 and the silicon layer (SOI layer) 3, 23 or 53 is not mentioned in each of the aforementioned embodiments, a step of flattening the source/drain regions 3b, 23b or 53b at the atomic layer level and thereafter depositing metal layers on the source/drain regions 3b, 23b or 53b can be easily performed when employing a (111) substrate or a (111) plane. In other words, it is known that a (111) plane of silicon can be flattened at the atomic layer level by selective wet etching with buffered hydrofluoric acid (BHF). In this case, the surface is terminated with hydrogen after treatment with the buffered hydrofluoric acid, and hence a clean and stable surface can be obtained in the atmosphere at a degree identical to that in a high vacuum. When a metal layer having a controlled work function is deposited on the flat surface under a low temperature and a high vacuum according to the present invention, the interface between the metal layer and silicon (source/drain region) can be approached to a more unpinned state.

What is claimed is:

1. A semiconductor device comprising:
   a pair of source/drain regions formed on the main surface of a silicon region at a prescribed interval to define a channel region and lifted up in an elevated structure;
   a gate insulator film, formed on said channel region, consisting of a high dielectric constant insulator film having a dielectric constant larger than 3.9;
   a gate electrode including a first metal layer coming into contact with said gate insulator film and having a work function controlled to have a Fermi level around the energy level of a band gap end of silicon constituting said source/drain regions; and
   source/drain electrodes, formed on the upper surfaces of said pair of source/drain regions having the elevated structure to be in contact with the upper surfaces of said pair of source/drain regions without interposition of metal silicide films, including third metal layers having a work function controlled to have a Fermi level around the energy level of the band gap end of silicon constituting said source/drain regions, wherein
   said source/drain regions include n-type source/drain regions;
   said source/drain electrodes include said third metal layers having said work function controlled to have a Fermi level around the energy level of the conduction band of silicon; and
   said third metal layers include Hf layers.

2. A semiconductor device comprising:
   a pair of source/drain regions formed on the main surface of a silicon region at a prescribed interval to define a channel region and lifted up in an elevated structure;
   a gate insulator film, formed on said channel region, consisting of a high dielectric constant insulator film having a dielectric constant larger than 3.9;
   a gate electrode including a first metal layer coming into contact with said gate insulator film and having a work function controlled to have a Fermi level around the energy level of a band gap end of silicon constituting said source/drain regions; and
   source/drain electrodes, formed on the upper surfaces of said pair of source/drain regions having the elevated structure to be in contact with the upper surfaces of said pair of source/drain regions without interposition of metal silicide films, including third metal layers having a work function controlled to have a Fermi level around the energy level of the band gap end of silicon constituting said source/drain regions, wherein
   said source/drain regions include p-type source/drain regions, and
   said source/drain electrodes include said third metal layers having said work function controlled to have a Fermi level around the energy level of the valence band of silicon.

3. The semiconductor device according to claim 2, wherein said third metal layers include either Ni layers or Ir layers.

4. A semiconductor device comprising:
   a pair of source/drain regions formed on the main surface of a silicon region at a prescribed interval to define a channel region and lifted up in an elevated structure;
   a gate insulator film, formed on said channel region, consisting of a high dielectric constant insulator film having a dielectric constant larger than 3.9;
   a gate electrode including a first metal layer coming into contact with said gate insulator film and having a work function controlled to have a Fermi level around the energy level of a band gap end of silicon constituting said source/drain regions; and
   source/drain electrodes, formed on the upper surfaces of said pair of source/drain regions having the elevated structure to be in contact with the upper surfaces of said pair of source/drain regions without interposition of metal silicide films, including third metal layers having a work function controlled to have a Fermi level around the energy level of the band gap end of silicon constituting said source/drain regions, wherein said pair of source/drain regions having the elevated structure include:

said third metal layers having said controlled work function, and fourth metal layers, formed on said third metal layers, having a larger thickness than said third metal layers.

5. The semiconductor device according to claim 4, wherein said fourth metal layers are metal layers having an uncontrolled work function.

6. The semiconductor device according to claim 4, wherein said fourth metal layers include at least either TaN layers or TiN layers.

* * * * *